United States Patent [19]

Yamagata et al.

[11] Patent Number: 5,405,802

[45] Date of Patent: Apr. 11, 1995

[54] PROCESS OF FABRICATING A SEMICONDUCTOR SUBSTRATE

[75] Inventors: Kenji Yamagata, Kawasaki; Takao Yonehara, Atsugi, both of Japan

[73] Assignee: Canon Kabushiki Kaisha, Tokyo, Japan

[21] Appl. No.: 249,067

[22] Filed: May 25, 1994

Related U.S. Application Data

[63] Continuation of Ser. No. 10,847, Jan. 29, 1993, abandoned.

[30] Foreign Application Priority Data

Jan. 31, 1992 [JP] Japan ..................... 4-016511

[51] Int. Cl.⁶ .......................................... H01L 21/302
[52] U.S. Cl. ............................. 437/71; 437/84; 437/86; 437/83; 437/974; 148/33.5
[58] Field of Search ............... 437/71, 83, 84, 86, 437/974; 148/DIG. 135, DIG. 150, 33.5

[56] References Cited

U.S. PATENT DOCUMENTS

| | | | |
|---|---|---|---|
| 4,177,094 | 12/1979 | Kroon ................................ | 437/86 |
| 4,501,060 | 2/1985 | Frye et al. ......................... | 29/576 W |
| 4,891,329 | 1/1990 | Reismau et al. ................... | 437/974 |
| 5,013,681 | 5/1991 | Godbey et al. ..................... | 437/83 |
| 5,028,558 | 7/1991 | Haisma et al. ..................... | 437/974 |

FOREIGN PATENT DOCUMENTS

| | | | |
|---|---|---|---|
| 0256713 | 11/1986 | Japan ................................. | 437/83 |
| 0084014 | 4/1988 | Japan ................................. | 437/83 |
| 0102244 | 5/1988 | Japan ................................. | 437/83 |
| 4-212409 | 8/1992 | Japan ................................. | 437/83 |
| 4-241414 | 8/1992 | Japan ................................. | 437/83 |
| 4-346414 | 12/1992 | Japan ................................. | 437/84 |

OTHER PUBLICATIONS

Cullen, "Single-Crystal Silicon on Non-Single Crystal Insulators", J. Cryst. Growth, vol. 63, No. 3, Oct., 1983, pp. 429–590.

Easter et al., "Polysilicon to Silicon Bonding etc.," Ext. Abst., vol. 91-2, p. 707, Abst. 478, Fall Meeting, Electrochem. Soc., Oct. 1991.

*Primary Examiner*—R. Bruce Breneman
*Assistant Examiner*—Ramamohan Rao Paladugu
*Attorney, Agent, or Firm*—Fitzpatrick, Cella, Harper & Scinto

[57] ABSTRACT

A process for preparing a semiconductor substrate comprises a step of porousifying a silicon monocrystalline substrate to form a porous layer, a step of making a silicon monocrystalline thin film to epitaxially grow on a surface of the porous layer, a step of oxidizing the surface of the epitaxial growth layer, a step of forming a deposited film on the oxidized surface, thereby obtainig a first substrate, a step of closely contacting the deposited film of the first substrate to a second substrate, a step of heat treating the closely contacted substrates and a step of selectively etching the porous layer.

12 Claims, 12 Drawing Sheets

PROCESS OF FABRICATING A SEMICONDUCTOR SUBSTRATE

This application is a continuation of application Ser. No. 08/010,847 filed Jan. 29, 1993, now abandoned.

BACKGROUND OF THE INVENTION

1. Field of the Invention

The present invention relates to a process for preparing an SOI semiconductor substrate by bonding and a semiconductor substrate obtained by the process.

2. Related Background Art

Formation of a monocrystalline Si semiconductor layer on an insulator is widely known as a silicon-on-insulator (SOI) technique and has been extensively studied because devices based on utilization of the SOI technique have many advantages that have not been obtained in case of bulk Si substrates for preparing ordinary Si integrated circuits, That is, the following advantages can be obtained by utilizing the SOI technique:

1. Easy dielectric isolation with a possibility of higher level integration
2. Distinguished resistance to radiation
3. Reduced floating capacity with a possibility of higher speed
4. Omission of well formation step
5. Prevention of latch-up
6. Possibility to form a fully depleted field effect transistor by thin film formation, etc.

To obtain the above-mentioned many advantages of device characteristics, processes for forming the SOI structure have been studied for these several ten years. The results are summarized, for example, in the following literature: Special Issue: "Single-crystal silicon on non-single crystal insulators", edited by G. W. Cullen, Journal of Crystal Growth, Volume 63, No. 3, pp. 429–590 (1983).

One of the SOI techniques, which have been now regarded as most promising, is a so called "bonding SOI" technique, which comprises tightly bonding two wafers, at least one of which has an insulating film formed on the surface by oxidation, etc., to each other at their mirror surfaces, applying thereto a heat treatment, thereby reinforcing the bonding at the tightly bonding interface, and grinding or etching the wafer (substrate) from one side thereof, thereby leaving a silicon monocrystalline thin film having a desired thickness to remain on the insulating film. The thin film obtained by the bonding SOI is originally a monocrystalline substrate itself and thus has a good controllability of crystal orientation and very less crystal defects. That is, the bonding SOI has been regarded as most distinguished in the crystal completeness among many SOI techniques.

However, the bonding SOI technique still has problem to be solved. The most important problem is a controllability of film thickness in the step of making one of two bonded silicon substrates into a uniformly thin film. That is, a silicon substrate usually having a thickness of a few hundred $\mu$m must be ground or etched to a thickness of a few $\mu$m or less than 1 $\mu$m, and it is technically difficult to obtain its good controllability and uniformity. Distribution of film thickness is a factor in fluctuations of electric characteristics of device to be formed thereon, and thus these problems must be urgently solved.

Another important problem is suppression of unbonded regions (which will be hereinafter referred to as "voids") generated at the tightly bonding interface between two substrates. Voids are generated by fine dusts having sizes of a few $\mu$m or less deposited on the interface on one hand, and it has been reported that the voids are also generated by bubbles introduced merely at the bonding or by water vapor resulting from chemical reactions at the interface when the bonded substrates are heat treated or by contamination of hydrocarbons physically adsorbed on the substrate surfaces before the bonding on the other hand. The size of the voids generated due to these causes is 1 $\mu$m or less to a few cm in diameter. When voids are generated in the bonded state of two substrates, the thin film parts on the void regions are peeled away and the void regions turn to holes in a thin film when ground or etched to make the thin film. On the thin film-peeled regions, i.e. holes, no such SOI device can be formed. Even if a thin film remains on the void regions, there is a very high possibility that the thin film parts on the void regions will be peeled away by a device-forming process.

Complete solution of these problems has been found yet, and thus the bonding SOI process has not been commercially employed, though it can provide a monocrystalline thin film of best quality among the SOI techniques.

From the viewpoint of film thickness controllability, the SOI formation based on selective polishing, reported by Hashimoto et al. is known as a process capable of controlling the film thickness with considerably high precision (Extended Abstracts of the 21st Conference on Solid State Devices and Materials, Tokyo, 1989, pp. 89–92). The process comprises forming island-shaped regions on the surface of a monocrystalline silicon substrate to serve as an active layer by anisotropic etching or by ordinary mass etching in advance, then oxidizing the surface, forming a deposit of polycrystalline silicon, etc. on the oxide film, flattening the surface of the deposit, bonding the flattened surface to another substrate to serve as a support substrate, grinding or polishing the open side (back side) of the initial monocrystalline silicon substrate. Since the island-shaped regions are formed on the silicon substrate and further oxidized, the oxide film in the region corresponding to the "valley" of the island-shaped regions is exposed at first by the polishing from the back side, and when the polishing is selectively discontinued at the time of the exposure, the island-shaped monocrystalline silicon thin film regions surrounded by the oxide film can be formed. This process based on the selective polishing technique can control the film thickness all over the entire surface of the substrate to some extent, but according to this process the silicon substrate surface is initially separated into island regions, and the thickness, region, etc. of SOI are determined by the area of the island-shaped regions and the depth of the separation groove, and thus the region for SOI (or device) is limited on the substrate. In other words, there coexist monocrystalline regions for forming a device and insulating regions for isolation on the same substrate surface, which is a factor for inhibiting a higher degree of integration or degree of freedom in the device design. This can be the largest disadvantage of SOI formation based on the selective polishing. That is, the insulating region for isolation must perform two functions, i.e. a stopper for the selective polishing and electrical isolation of a device, in the same insulating layer. In the exact control of the polishing end point, the larger the area of the insulating layer, the better. However, from the viewpoint of electrical isolation of a device, the region for isolation has a such a width as to prevent a current leakage. Actually, there is such a problem of antinomy that the width of the region for isolation cannot be too large due to the requirements for a higher degree of integration of a device.

As reported by Wada et al. as to the selective polishing, the so called "overpolishing", which means that the center part of the intermediate region between isolating layers is much more polished, inevitably occurs (8th International Workshop on Future Electron Devices (Three-dimensional ICs and Nanometer Functional Devices) Mar. 14–16, 1990 in Kochi, Japan, pp. 81–84). Strictly speaking, it is quite difficult to conduct film thickness control in a ultrathin film region having a thickness of 0.1 $\mu$m or less. That is, the area for region and the width of the region for isolation are strictly limited by the optimum conditions for the selective polishing.

As to a process for forming an SOI device by the similar device isolation process before the above-mentioned prior art, there are reports by Robert C. Frye (U.S. Pat. No. 4,501,060) and W. G. Easter et al. (Electrochemical Society: Extended Abstract of the 180th Society Meeting, Vol. 91–2, Fall 1991, pp 707). According to the former Frye process, a monocrystalline silicon substrate is subjected to anisotropic etching to form an island-shaped region surrounded by a deep groove, and then the surface is oxidized and then polycrystalline silicon is deposited thereon until the polycrystalline silicon completely fills the grooves. Then, the surface of the polycrystalline silicon layer is flattened by polishing and bonded to a support substrate. Finally, the bonded substrates are polished from the open side of the monocrystalline substrate, and the polishing is discontinued when the monocrystalline region is separated in an island shape while leaving an appropriate film thickness to remain. This process has not any particular concept on the film thickness control of SOI thin film by selective polishing and pays no attention to the thin film formation. In this process, there are the same problems of limitation of regions for isolation, degree of freedom in device design, etc. as in the above-mentioned prior art.

The latter Easter et al. process employs the substantially same process steps as in the Frye process and thus has quite similar problems to those of the former Frye process.

As described above, a technique capable of providing a SOI substrate, which can satisfy the preparation of an electronic device of high performance, with a good productivity has not been attained yet.

SUMMARY OF THE INVENTION

An object of the present invention is to provide a substrate of good film thickness distribution with a good productivity in the preparation of an SOI substrate of good performance by bonding, and also to provide an SOI substrate in such a structure as not to give an adverse effect on the formation of a thin film device by microfine voids even if such microfine voids are generated on the interface of bonded substrates.

Another object of the present invention is to provide a semiconductor substrate having advantages of SOI structure and applicable to various electronic devices of high performance and also to provide a process for preparing the same.

Other object of the present invention is to provide a semiconductor substrate capable of serving as a substitute for expensive SOS or SIMOX in the preparation of large scale integrated circuit of SOI structure and also to provide a process for preparing the same.

Further object of the present invention is to provide a process for preparing a semiconductor substrate, which comprises a step of porousifying a silicon monocrystalline substrate to form a porous layer, a step of making a silicon monocrystalline thin film to epitaxially grow on a surface of the porous layer, a step of oxidizing the surface of the epitaxial layer, a step of forming a deposited film on the oxidized surface, thereby obtaining a first substrate, a step of closely contacting the deposited film, of the first substrate to a second substrate, a step of heat treating the closely contacted substrates and a step of selectively etching the porous layer.

DETAILED DESCRIPTION OF THE PREFERRED EMBODIMENTS

Figure 1A:
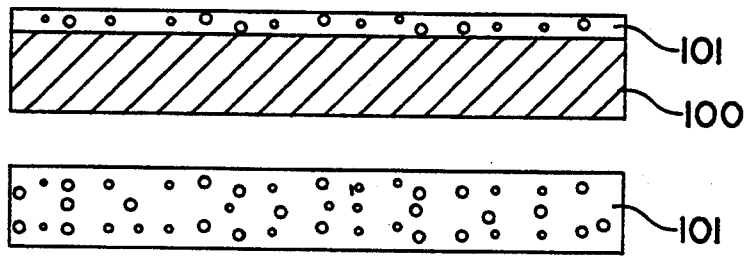
FIGS. 1A to 11B are schematic cross-sectional views according to embodiments of the present processes for preparing a semiconductor device.

The present process for preparing a semiconductor substrate is characterized by a step of porousifying a silicon monocrystalline substrate to form a porous layer, a step of making a silicon monocrystalline thin film to epitaxially grow on a surface of the porous layer, a step of oxidizing the surface of the epitaxial layer, a step of forming a deposited film on the oxidized surface, thereby obtaining a first substrate, a step of closely contacting the deposited film of the first substrate to a second substrate, a step of heat treating the closely contacted substrates and a step of selectively etching the porous layer.

The present semiconductor substrate is characterized by being obtained through a step of porousifying a silicon monocrystalline substrate to form a porous layer, a step of making a silicon monocrystalline thin film to epitaxially grow on a surface of the porous layer, a step of oxidizing the surface of the epitaxial layer, a step of forming a deposited film on the oxidized surface, thereby obtaining a first substrate, a step of closely contacting the deposited film of the first substrate to a second substrate, a step of heat treating the closely contacted substrates and a step of selectively etching the porous layer.

The main characteristic of the present invention is use of bonding technique, and the various problems of the prior art can be solved by the following two characteristics of the present invention, i.e. use of an epitaxial growth film as an active layer in place of the conventional silicon substrate and location of the bonding interface far from the active layer.

The following two physical effects possessed by porous silicon play an important role in solving the problem of film thickness distribution among the above-mentioned problems. One is an epitaxial growth characteristic. Porous silicon retains a monocrystalline structure as a crystal structure and there are pores having sizes of several tens to several hundred Å from the surface inwardly at a high density. Epitaxial layer growing on this surface characteristically has an equivalent crystallinity to that of an epitaxial layer on the ordinary monocrystalline substrate. Thus, the epitaxial layer of high reliability is used as an active layer, and an SOI substrate having a distinguished crystallinity can be provided, and the film thickness distribution is much better, because the film thickness of the active layer is controlled by the epitaxial growth.

Another important effect is an etching characteristic of porous silicon. Usually, silicon is not substantially etched by hydrofluoric acid, but can be etched by hydrofluoric acid if silicon is made porous. Furthermore, when a liquid etching mixture of hydrofluoric acid and aqueous hydrogen peroxide solution is used, there is a difference in the etching rate by about $10^5$ or more between the non-porous silicon and the porous silicon. Thus, selective etching of even a thin layer having a thickness of 1 μm or less can be made uniformly under a good control.

Figure 13A:
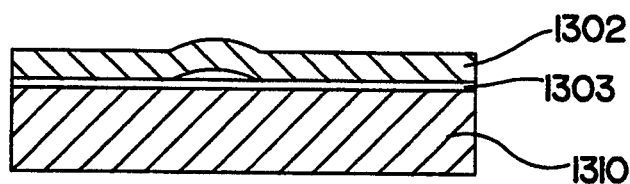
FIGS. 13A to 13C are schematic cross-sectional views illustrating void generation region in the conventional bonded SOI and the present SOI.
Figure 13B:
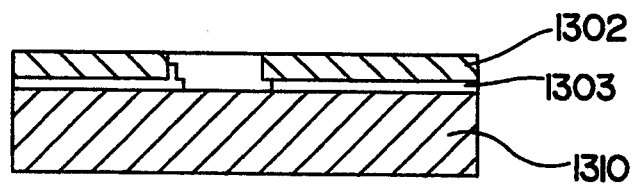
Figure 13C:
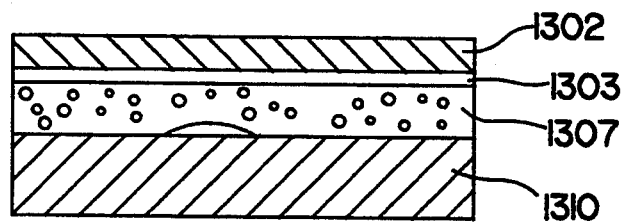

A deposited film on the oxide film plays an important role in solving the problem of influence of voids on a device among the above-mentioned problems. What is most important in the bonding is to eliminate foreign matters such as dusts, etc. from the bonding interface. To eliminate the foreign matters such as dusts, etc., it is better to conduct bonding operation in a very clean atmosphere, but the foreign matters cannot be completely eliminated even in such a circumstance. Microfine dusts that cannot be eliminated by any means or voids generated not by the dusts can be made permissible to some extent in the present invention. It is the role of a deposited film on the oxide film to make such a permission. If there is no deposited film, the surface of the oxide film is directly bonded to the second substrate, and the silicon film in the void-generated region is in such a state that: the thin film is separated from the substrate as if there is no supporting matrix, as shown in FIG. 13A. In such a state, the film is readily broken, because the thin film has a low rigidity, and the thin film is peeled away (FIG. 13B). By providing a deposited film of silicon, etc. on the oxide film, the bonding interface is made far from the silicon thin film. That is, the void can be made far off and at the same time the silicon thin film right over the void can be given a proper rigidity. Thus, even if a void is generated, there is no possibility of film breakage or peeling (FIG. 13C). In FIGS. 13A to 13C, numeral 1302 is an epitaxial growth layer, 1303 an oxide layer of the epitaxial growth layer, 1307 a deposited layer and 1310 a second substrate (arbitrary substrate).

One embodiment of the present invention will be described below, referring to FIGS. 1 and 12.

As shown in FIG. 1A, a monocrystalline silicon substrate 100 is anodized to form porous silicon 101. The region to be made porous may be only a surface layer on one side of the substrate or throughout the substrate. In case of making only the surface layer on one side of the substrate porous, the region may have a thickness of 10 to 100 μm.

A procedure for forming porous silicon will be explained, referring to FIGS. 12A and 12B.

A p-type monocrystalline silicon substrate 1200 is provided as a substrate. An n-type substrate can be also used, but in that case it is limited to a substrate of low resistivity. The substrate 1200 is set in an apparatus as shown in FIG. 12A, where one side of the substrate is in contact with a hydrofluoric acid-based solution 1204 and a negative electrode 1206 is provided in the solution. The other side of the substrate is in contact with a positive metallic electrode 1205.

Figure 12A:
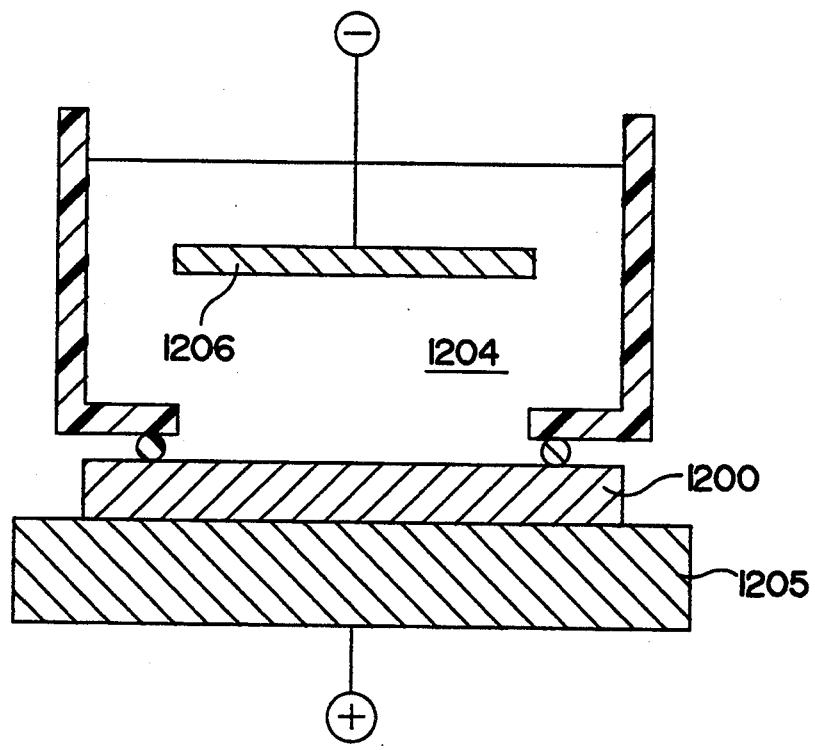
FIGS. 12A and 12B are schematic cross-sectional views of an apparatus for use in making a silicon substrate porous.
Figure 12B:
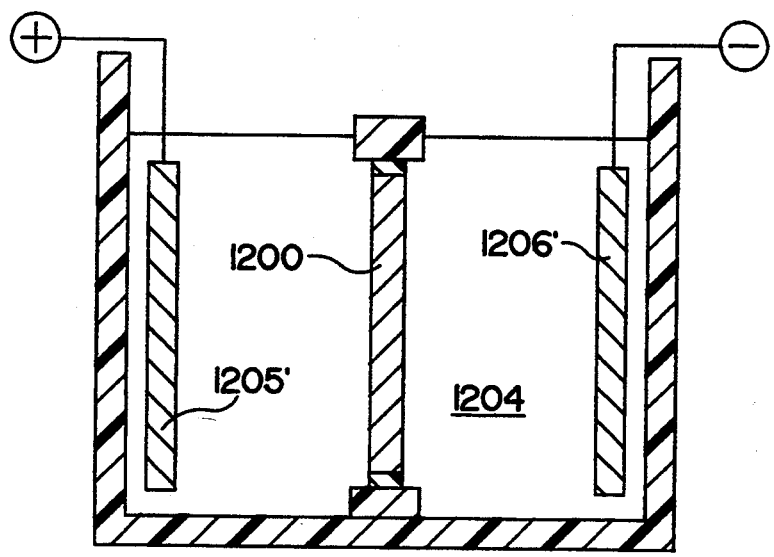

As shown in FIG. 12B, a positive electrode 1205' may have a potential through a solution 1204'. In any way, to make the substrate porous starts on the negative electrode-face side of the substrate in contact with the hydrofluoric acid-based solution. As the hydrofluoric acid-based solution 1204, usually concentrated hydrofluoric acid (49% HF) is used. Through dilution with water, etching unpreferably starts at some concentration, though dependent on a current density. In some cases, bubbles are generated on the surface of substrate 1200 during the anodization, and alcohol is added thereto as a surfactant to efficiently remove the bubbles. As alcohol, methanol, ethanol, propanol, isopropanol, etc. can be used. Anodization can be carried out while stirring the solution with a stirrer in place of the surfactant. The negative electrode is made from such a material as not to be attacked by the hydrofluoric acid-based solution, for example, gold (Au), platinum (Pt), etc. The positive electrode 1205 can be made from the ordinary metallic material, but when the anodization is made throughout the substrate 1200, the hydrofluoric acid-based solution will reach the positive electrode 1205, and thus the surface of the positive electrode 1205 is preferably coated with a metallic film having a resistance to the hydrofluoric acid-based solution. The current density for the anodization is maximum several hundred mA/cm$^2$ and minimum is any value except zero. The current density depends on a range capable of making epitaxial growth of good quality on the surface of the resulting porous silicon. Usually the higher the current density, the higher the anodization rate and at the same time the lower the density of porous silicon layer. That is, the volume occupied by the pores is increased, and the conditions for the epitaxial growth are changed thereby.

Figure 1B:
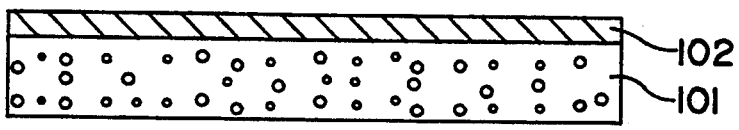

As shown in FIG. 1B, a nonporous monocrystalline silicon layer 102 is made to epitaxially grow on the thus formed porous silicon substrate or porous layer 101. The epitaxial growth is carried out by ordinary thermal CVD, vacuum CVD, plasma CVD, molecular beam epitaxy, sputtering, etc. The thickness of the epitaxial growth film may be the same as the design thickness of SOI layer.

Figure 1C:
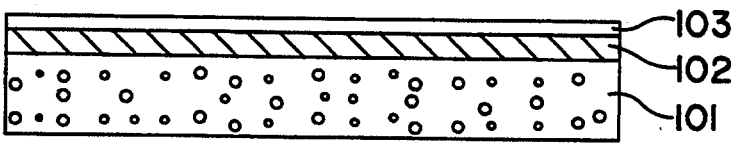

As shown in FIG. 1C, the surface of the epitaxial growth layer 102 is oxidized to form an SiO$_2$ layer 103. The oxide film 103 acts as an insulating layer (I layer) of SOI structure. Oxidation of the epitaxial layer 102 also means a decrease in the interface level density at the interface between the epitaxial layer 102 as an active layer and the insulating underlayer when a device is formed on the completed SOI substrate. It is preferable that the oxide film of the epitaxial layer has a thickness of 0.5 to 1.0 μm so as to utilize the characteristics of SOI device.

Figure 1D:
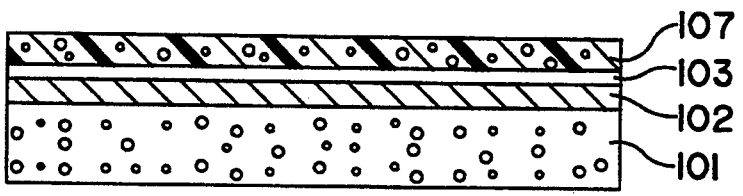

Then, as shown in FIG. 1D, a deposit 107 is formed on the surface of the oxide layer 103. The deposit is basically any one of silicon films such as polycrystalline silicon film, amorphous silicon film, etc., a silicon oxide film, a silicon nitride film, an insulator film, a semiconductor film, and a multilayer film of these films. Deposition process is also not particularly limited. The film thickness of the deposit 107 is not particularly limited, but the larger the film thickness, the less the influence of voids. Thus, the film thickness may be determined within such a range as to readily form the deposit under the ordinary process conditions of a deposition apparatus. To eliminate the influence of voids, the thickness of the deposit film is preferably about 2 $\mu$m or more, more preferably 10 $\mu$m or more, though dependent on the sizes of voids, and there is particularly no upper limit, but in view of stresses on the deposited film, process time, etc., the upper limit is preferably about 30 $\mu$m. For example, a silicon thin film having a bonding interface at a position located far by about 30 $\mu$m has no substantial influence -of voids having sizes of a few $\mu$m or less, except for voids having a centimeter size.

In some cases, the deposit 107 obtained by CVD, etc. has a considerable surface unevenness. The surface flatness of the substrate is important for bonding substrates to each other, and when the substrate surface has such an unevenness, the surface may preferably be flattened by polishing the substrate surface. The substrate obtained through the foregoing step will be hereinafter referred to as "first substrate".

Figure 1E:
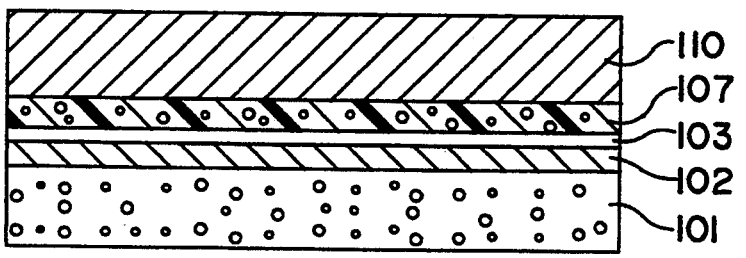

As shown in FIG. 1E, the first substrate is bonded to a second substrate 110 at their mirror surfaces, and then the bonded substrates are subjected to heat treatment. The heat treatment is carried out at such a temperature that peeling, etc. may not occur at the bonding interface in the successive polishing or etching step. Specifically, the heat treatment temperature is preferably about 100° C. or higher, more preferably 800° C. or higher. When the heat treatment is carried out at a relatively low temperature, it is preferable to conduct heat treatment at about 1,000° C. after the polishing or etching has been finished and an ultimate SOI structure has been obtained. The latter heat treatment is directed to preventing film peeling, etc. due to heat stresses during the device process.

The second substrate 110 can be freely selected from a silicon substrate, a quartz substrate and other ceramic substrates.

Figure 1F:
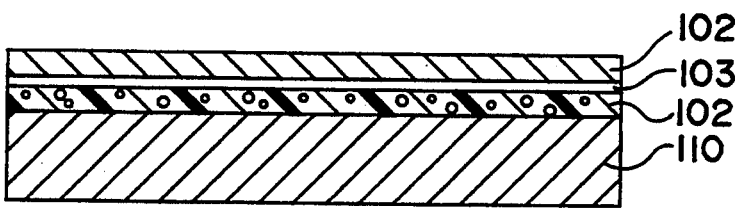

As shown in FIG. 1F, the porous part 101 is then selectively removed from the open Side of the first substrate, while leaving the epitaxial growth layer 102 to remain. When the part to be removed is porous throughout that part, the porous part 101 can be selectively etched away by dipping the bonded substrates into a hydrofluoric acid-based solution. When the part to be etched contains a region of monocrystalline silicon substrate 100 as such, it is preferable to remove the region of silicon substrate 100 by polishing. When the porous part 101 is exposed, the polishing is discontinued, and then selective etching can be carried out with a hydrofluoric acid-based solution. In any way, the non-porous, monocrystalline epitaxial growth part 102 remains as a thin film, because it does not react with a hydrofluoric acid-based solution substantially at all. When the second substrate 110 is composed mainly of SiO$_2$, it is readily attacked by a hydrofluoric acid-based solution, and thus it is preferable to deposit a silicon nitride film or other materials which are hard to react with the hydrofluoric acid-based solution by CVD, etc. on the opposite side (open side) of the second substrate 110 to the bonding side in advance. Furthermore, the porous part 101 is made thinner to some extent before the bonded substrates are dipped in the etching solution, thereby shortening the time required for the selective etching of the porous part, and consequently preventing the second substrate from the excessive reaction. If the second substrate is composed of a material that is hard to react with a hydrofluoric acid-based solution, such as silicon, there is no such problem as above.

The hydrofluoric acid-based solution for use in the selective etching includes hydrofluoric acid and a mixture of hydrofluoric acid with hydrogen peroxide solution (H$_2$O$_2$) and/or alcohol. Selective etching of porous silicon can be made with a liquid mixture of hydrofluoric acid and nitric acid, or further containing acetic acid, but the epitaxial silicon film 102 to be retained will be slightly etched and thus it is necessary to control the etching time, etc. exactly.

Through the foregoing steps, an SOI substrate comprising the second substrate 110, and the deposit 107, the silicon oxide film 103 and the epitaxial silicon layer 102, successively laid thereon, can be obtained.

The present invention will be explained in detail below, referring to Examples, which will not limitative of the present invention.

EXAMPLE 1

As shown in FIG. 1A, a p-type (100) monocrystalline silicon substrate having a thickness of 200 $\mu$m and a resistivity of 0.1 to 0.2 $\Omega$·cm, 4 inches in diameter, was set in an apparatus as shown in FIG. 12A and anodized to obtain a porous silicon 101. Anodizing was carried out in an aqueous 49% HF solution as the solution 1204 at a current density of 100 mA/cm$^2$. The rate of porous formation was 8.4 $\mu$m/min. and the p-type (100) silicon substrate having the thickness of 200 $\mu$m was made porous throughout the substrate within 24 minutes.

As shown in FIG. 1B, a monocrystalline silicon layer 102 was made to epitaxially grow to a thickness of 1.0 $\mu$m on the p-type (100) porous silicon substrate 101 by CVD. The deposition conditions are given below:
Source gas: SiH$_4$/H$_2$
Gas flow rate: 0.62/140 (l/min.)
Temperature: 750° C.
Pressure: 80 Torr
Growth rate: 0.12 $\mu$m/min.

As shown in FIG. 1C, the surface of the epitaxial growth layer 102 was oxidized in a steam atmosphere at 1,000° C. to obtain a silicon oxide film 103 having a thickness of 0.5 $\mu$m.

As shown in FIG. 1D, a polycrystalline silicon film 107 having a thickness of 10 $\mu$m was formed from a gas mixture of SiH$_4$/H$_2$ on the oxide film 103 by thermal CVD at 800° C. Furthermore, the polycrystalline silicon film surface having fine unevenness was flattened by polishing, whereby a first substrate was obtained.

As shown in FIG. 1E, a silicon substrate 110, 4 inches in diameter as a second substrate was washed with a solution of HCl:H$_2$O$_2$:H$_2$O and then thoroughly with water together with the first substrate and then the first and the second substrates were bonded to each other at their mirror surfaces. The bonded substrates were heat treated at 1,100° C. for 2 hours in a nitrogen atmosphere to increase the bonding strength at the interface between the bonded substrates.

As shown in FIG. 1F, the closely contacted substrates after the heat treatment were dipped in a selective etching solution to selectively etch only the porous part 101. Composition of the etching solution and etching rate of porous silicon are as follows:
HF:H$_2$O$_2$:C$_2$H$_5$OH=5:25:6
Etching rate: 1.6 $\mu$m/min.

Thus, the porous part having a thickness of 200 μm was entirely etched away within about 125 minutes. The etching rate of the monocrystalline silicon layer 102 was 0.0006 μm/hour, and thus the monocrystalline silicon layer 102 remained without any substantial etching.

Through the foregoing steps, an SOI substrate comprising the silicon substrate 110, and the polycrystalline silicon film 107, the silicon oxide film 103, and the epitaxial layer 102, successively laid thereon, was obtained.

To make comparison of influences by voids, an SOI substrate was prepared in the same manner as above, only without the step of depositing the polycrystalline silicon film 107, and inspected by an optical microscope. Voids, about 1 μm to about 10 μm in diameter, were found at a density of about 4 voids/cm$^2$, and about one half of these voids underwent film breakage. On the other hand, the SOI substrate having the polycrystalline silicon film 107 prepared through the foregoing steps was found to have no voids by the same optical microscope.

EXAMPLE 2

This example will be explained, referring to FIGS. 2A-2F.

Figure 2A:
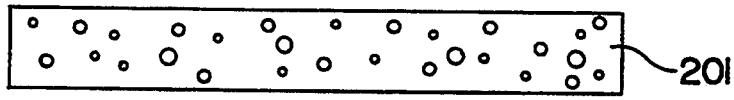

As shown in FIG. 2A, a p-type (100) silicon substrate 200 having a thickness of 200 μm and a resistivity of 0.01 Ω·cm was made porous 201 throughout in the same manner as in Example 1.

Figure 2B:
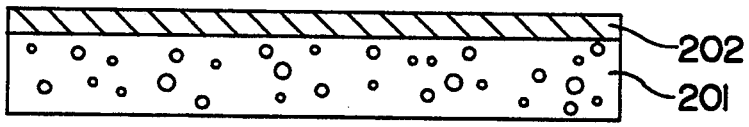

As shown in FIG. 2B, an epitaxial layer 202 was formed to a thickness of 0.5 μm on one surface of the thus obtained substrate in the same manner as in Example 1.

Figure 2C:
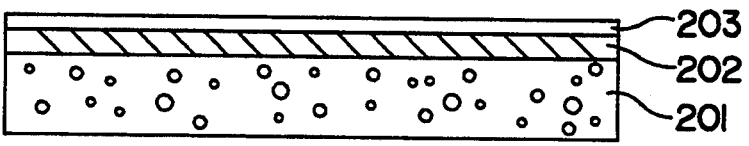

As shown in FIG. 2C, an oxide film 203 was formed on the surface of the epitaxial layer 202 by thermal oxidation, whereby the thickness of the epitaxial layer 202 was reduced to about 0.25 μm.

Figure 2D:
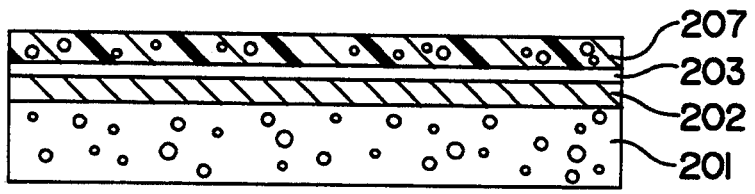

As shown in FIG. 2D, an amorphous silicon film 207 was deposited to a thickness of 3 μm on the thus formed oxide film 203 by LPCVD, whereby a first substrate was obtained. The surface of the amorphous silicon film 107 was very flat and was used in such a state without polishing in the next bonding step.

Figure 2E:
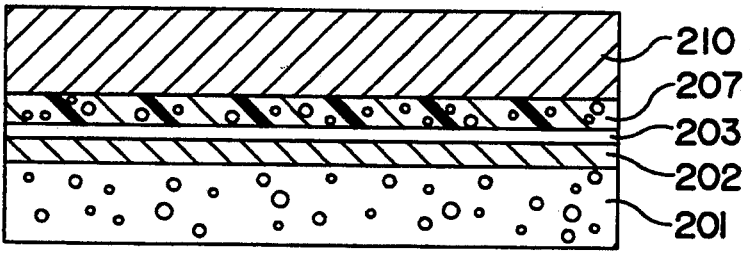

As shown in FIG. 2E, the first substrate was bonded to the same second substrate as used in Example 1 in the same manner as in Example 1.

Figure 2F:
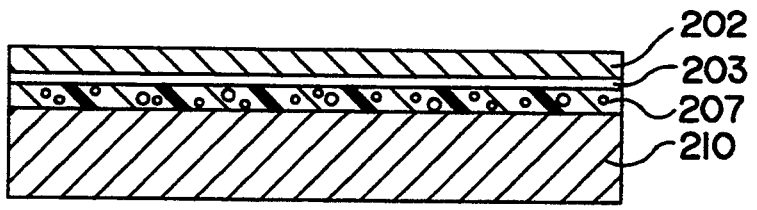

As shown in FIG. 2F, the porous silicon part 201 was selectively etched away in the same etching process as in Example 1.

Through the foregoing steps, an SOI substrate comprising the silicon substrate 210, and the amorphous silicon film (changed to polycrystalline state by the heat treatment) 207, the silicon oxide film 203 and the epitaxial layer 202, successively laid thereon, was obtained. Inspection by an optical microscope revealed that there were no voids at all as in Example 1.

EXAMPLE 3

This example will be explained, referring to FIGS. 3A-3F.

Figure 3A:
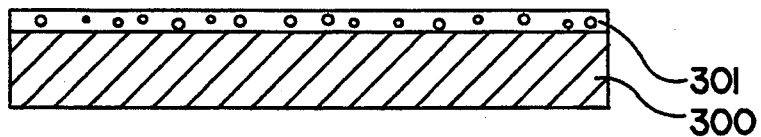

As shown in FIG. 3A, a p-type (100) silicon substrate 300 having a thickness of 400 μm and a resistivity of 0.01 Ω·cm was made porous only to a depth of 20 μm from the surface to form a porous layer 301.

Figure 3B:
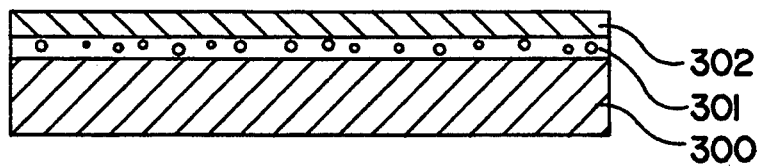

As shown in FIG. 3B, an epitaxial layer 302 was formed to a thickness of 0.5 μm on the porous surface of the substrate in the same manner as in Example 1.

Figure 3C:
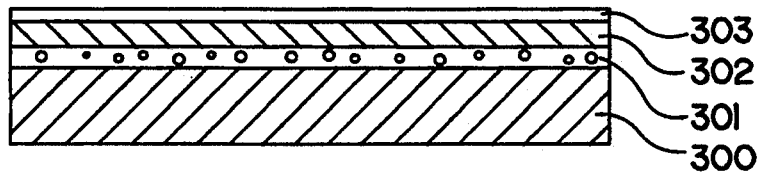

As shown in FIG. 3C, an oxide film 303 having a thickness of 0.5 μm was formed on the surface of the epitaxial layer 302 by thermal oxidation, whereby the thickness of the epitaxial layer 302 was reduced to about 0.25 μm.

Figure 3D:
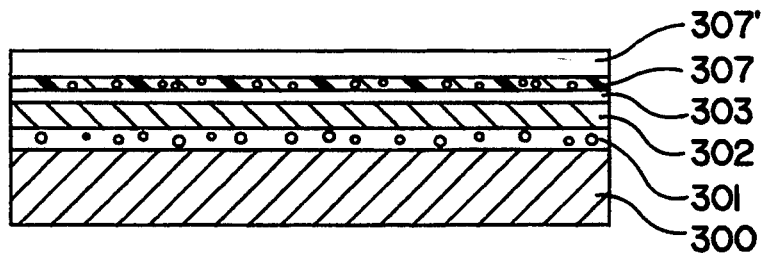

As shown in FIG. 3D, a silicon nitride film 307 having a thickness of 0.5 μm was deposited on the surface of the oxide film 302 by plasma CVD, and a silicon oxide film 307' having a thickness of 3 μm was deposited thereon by CVD under the atmospheric pressure.

Figure 3E:
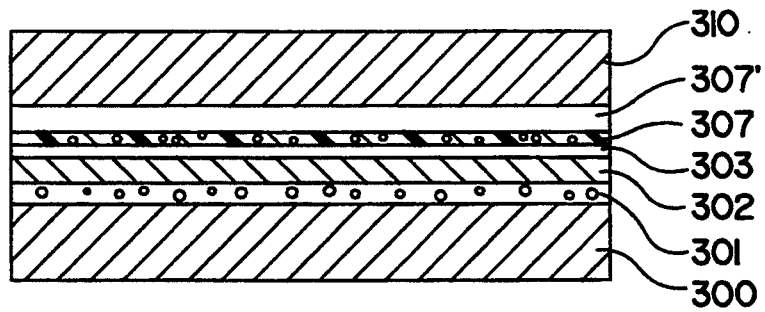

As shown in FIG. 3E, the thus obtained substrate was bonded to the same second substrate as used in Example 1 in the same manner as in Example 1, whereby bonded substrates were obtained.

Figure 3F:
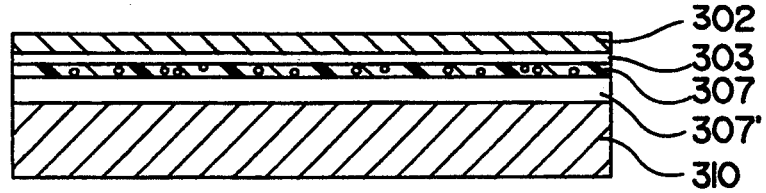

As shown in FIG. 3F, the monocrystalline silicon substrate part 300 of the first substrate was entirely ground off by mechanical polishing to expose the porous part 301, and the porous silicon part 301 was selectively etched in the same etching process as in Example 1. The thickness of the porous silicon part 301 to be etched was about 20 μm or less, and thus the porous silicon part 301 was entirely etched away within 10 minutes. An SOI substrate comprising the silicon substrate 310, and the silicon oxide film 307', the silicon nitride film 307, the silicon oxide film 303 and the epitaxial layer 302, successively laid thereon, was obtained. Inspection of the thus obtained SOI substrate by an optical microscope revealed that there were no voids at all.

EXAMPLE 4

This example will be explained, referring to FIGS. 4A-4D.

Figure 4A:
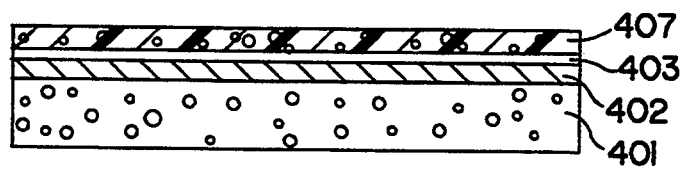

As shown in FIG. 4A, a first substrate was prepared through the same steps as in Example 1.

Figure 4B:
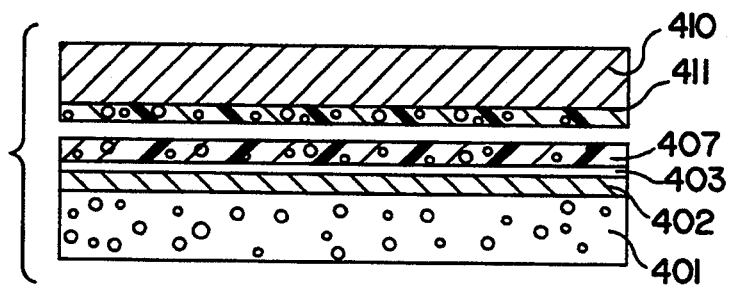

As shown in FIG. 4B, a silicon substrate 410, 4 inches in diameter, was provided as a second substrate and an oxide film 411 having a thickness of 0.5 μm was formed on the surface of the second substrate.

Figure 4C:
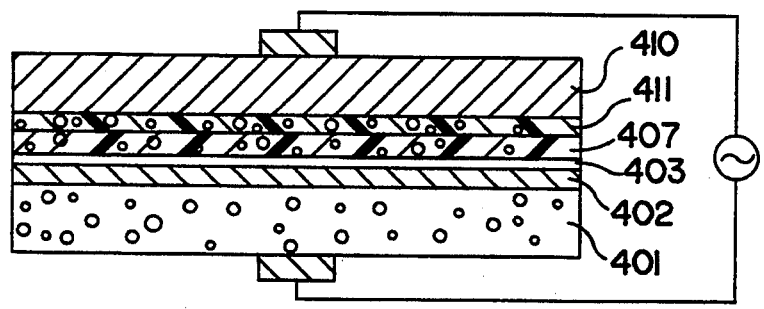

As shown in FIG. 4C, both substrates were thoroughly washed and then closely contacted to each other, and a voltage was applied between the first and the second substrates. Bonding was effected by the application of an electrostatic force to the bonding interface. Then, the bonded substrates were heat treated at 1,000° C. for 30 minutes.

Figure 4D:
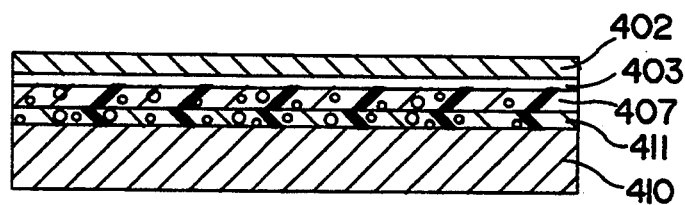

As shown in FIG. 4D, the porous layer 401 was selectively etched in the same manner as in Example 1, whereby an SOI substrate comprising the silicon substrate 410, and the silicon oxide film 411, a polycrystalline silicon film 407, a silicon oxide film 403 and an epitaxial layer 402, successively formed thereon, was obtained. Inspection of the SOI substrate by an optical microscope revealed that there were no voids at all.

EXAMPLE 5

This example will be explained, referring to FIGS. 5A-5D.

Figure 5A:
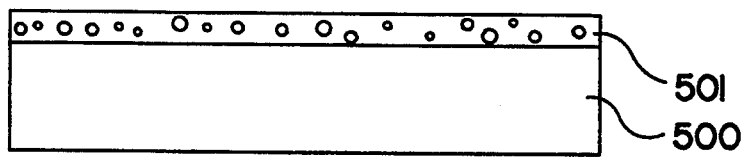
Figure 5B:
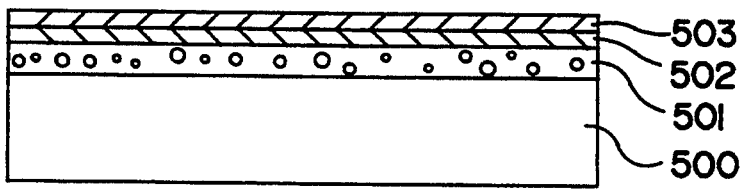
Figure 5C:
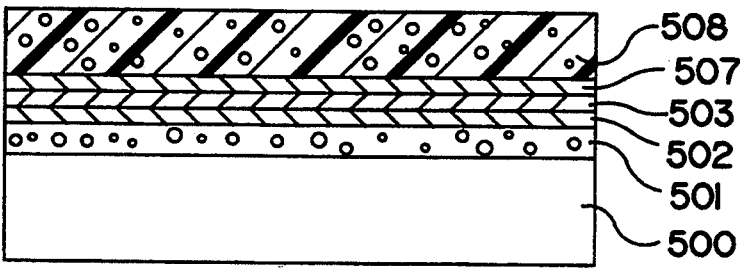

A p-type (100) substrate 500 having a thickness of 625 μm and a resistivity of 0.01 Ω·cm, 5 inches in diameter, was made porous only to a depth of 20 μm from the surface to form a porous layer 501 (FIG. 5A). An epitaxial silicon layer 502 was formed to a thickness of 0.15 μm on the porous silicon layer 501 in the same manner as in Example 1, and then the surface of the epitaxial layer 502 was oxidized to a depth of 0.1 μm by thermal oxidation to form an oxide layer 503 (FIG. 5B), whereby the thickness of the epitaxial layer was reduced to 0.1 μm. An SiO$_2$ film (NSG film) 507 having a thickness of 0.7 μm was deposited on the surface of the oxide film 503 from SiH$_4$/O$_2$ by CVD under the atmospheric pressure, and further a polycrystalline silicon layer 508 having a thickness of 30 μm was deposited thereon in the same manner as in Example 1. The surface of the polycrystalline silicon layer 508 was polished to obtain a mirror surface, whereby a first substrate was obtained (FIG. 5C).

Figure 5D:
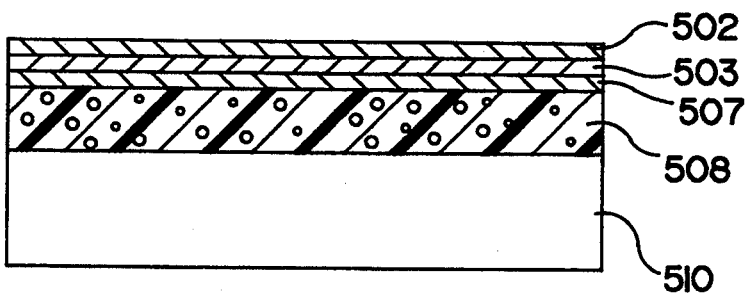

A silicon substrate 510, 5 inches in diameter, was used as a second substrate, and bonded to the first substrate in the same manner as Example 1. The monocrystalline silicon part 500 of the first substrate, about 600 μm in thickness, was removed from the open side thereof by grinding, and then the porous silicon layer 501 was selectively etched in an HF/H$_2$O$_2$ solution to obtain an SOI substrate having a monocrystalline silicon layer having a thickness of 0.1 μm on the SiO$_2$ layer having a thickness of 0.8 μm (FIG. 5D).

EXAMPLE 6

This example will be explained, referring to FIGS. 6A–6D.

Figure 6A:
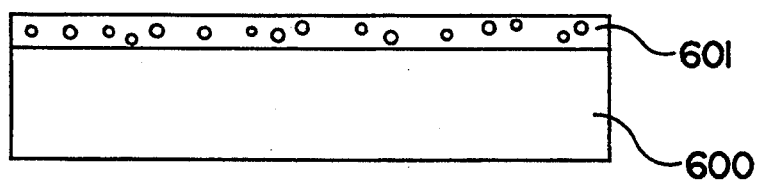
Figure 6B:
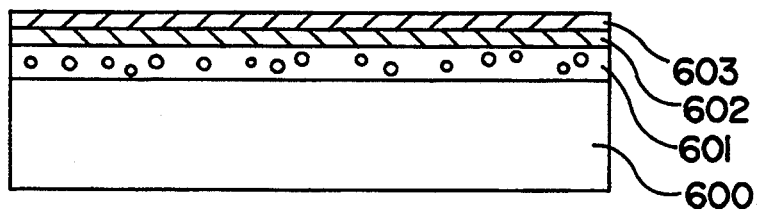
Figure 6C:
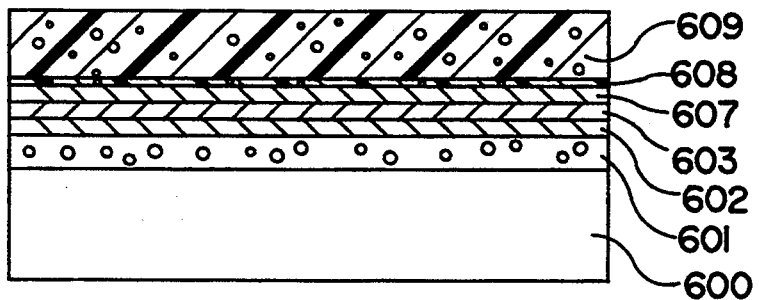

A p-type (100) substrate 600 having a thickness of 625 μm and a resistivity of 0.01 Ω·cm, 5 inches in diameter, was made porous only to a depth of 20 μm from the surface to form a porous layer 601 (FIG. 6A). An epitaxial silicon layer 602 was formed to a thickness of 0.15 μm on the porous silicon layer 601 in the same manner as in Example 1, and then the surface of the epitaxial layer 602 was oxidized to a depth of 0.1 μm by thermal oxidation to form an oxide layer 603 (FIG. 6B), whereby the thickness of the epitaxial layer was reduced to 0.1 μm. An SiO$_2$ film (NSG film) having a thickness of 0.7 μm was deposited on the surface of the oxide film 603 from SiH$_4$/O$_2$ by CVD under the atmospheric pressure, and further an Si$_3$N$_4$ film 608 having a thickness of 0.2 μm was deposited on the NSG film by vacuum CVD. Further a polycrystalline silicon layer 609 having a thickness of 30 μm was deposited thereon in the same manner as in Example 1. The surface of the polycrystalline silicon layer 609 was polished to obtain a mirror surface, whereby a first substrate was obtained (FIG. 6C).

Figure 6D:
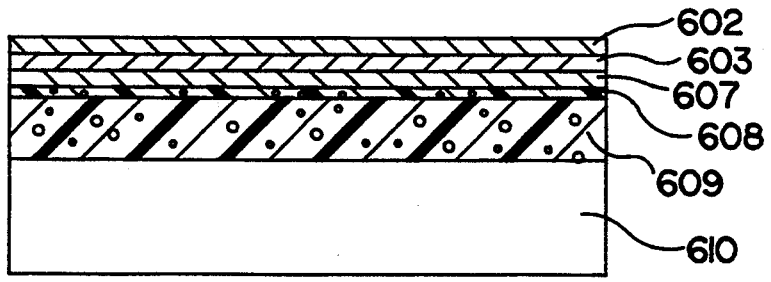

A silicon substrate 610, 5 inches in diameter, was used as a second substrate, and bonded to the first substrate by heat treatment at 800° C. The monocrystalline silicon part 600 of the first substrate was removed to a depth of about 600 μm from the open side thereof by grinding, and then the porous silicon layer 601 was selectively etched in an HF/H$_2$O$_2$ mixed solution to obtain an SOI substrate having a monocrystalline silicon layer having a thickness of 0.1 μm on the SiO$_2$ layer having a thickness of 0.8 μm (FIG. 6D).

EXAMPLE 7

This example will be explained, referring to FIGS. 7A–7D.

Figure 7A:
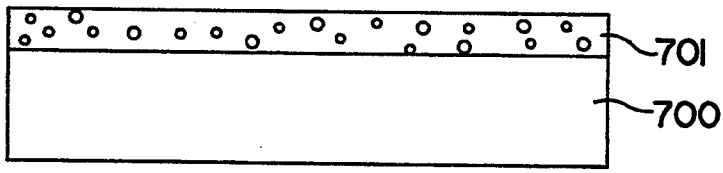
Figure 7B:
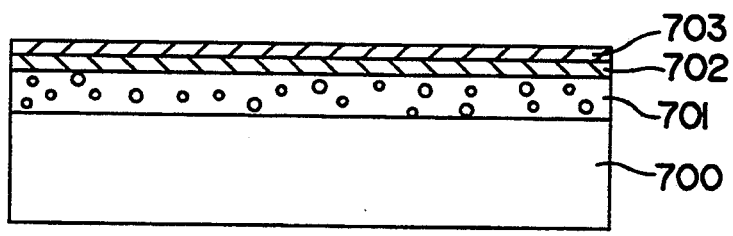

A p-type (100) substrate 700 having a thickness of 625 μm and a resistivity of 0.01 Ω·cm, 5 inches in diameter, was made porous only to a depth of 20 μm from the surface to form a porous layer 701 (FIG. 7A). An epitaxial silicon layer 702 was formed to a thickness of 0.15 μm on the porous silicon layer 701 in the same manner as in Example 1, and then the surface of the epitaxial layer 702 was oxidized to a depth of 0.1 μm by thermal oxidation to form an oxide layer 703 (FIG. 7B), whereby the thickness of the epitaxial layer was reduced to 0.1 μm.

Figure 7C:
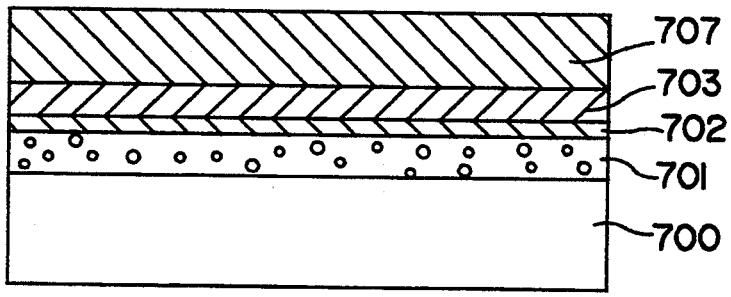

A BPSG (boro-phospho-silicate glass) film 707 having a thickness of 15 μm was deposited from TEOS (tetraethoxysilane)/O$_3$ on the surface of the oxide film 703 by CVD under the atmospheric pressure, and then the BPSG film was subjected to reflow in an oxygen atmosphere at 1,000° C. for 30 minutes to remove moistures from the film and also to flatten the film surface, whereby a first substrate was prepared (FIG. 7C).

Figure 7D:
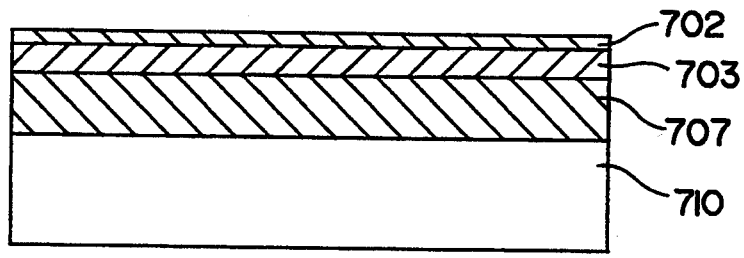

A melt quartz substrate 710, 5 inches in diameter, was used as a second substrate, and bonded to the first substrate by a heat treatment at 500° C. in the same manner as Example 1. The monocrystalline silicon part 700 of the first substrate was removed to a depth of about 600 μm from the open side thereof by grinding, and then the porous silicon layer 701 was selectively etched in an HF/H$_2$O$_2$ solution to obtain an SOI substrate having a monocrystalline silicon layer having a thickness of 0.1 μm on the transparent SiO$_2$ substrate (FIG. 7D). Ultimately, the finished substrate was annealed in a nitrogen atmosphere at 1,000° C. for 30 minutes to increase the bonding strength of the bonding interface.

EXAMPLE 8

This example will be explained, referring to FIGS. 8A–8D.

Figure 8A:
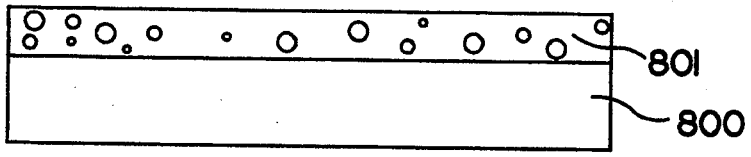
Figure 8B:
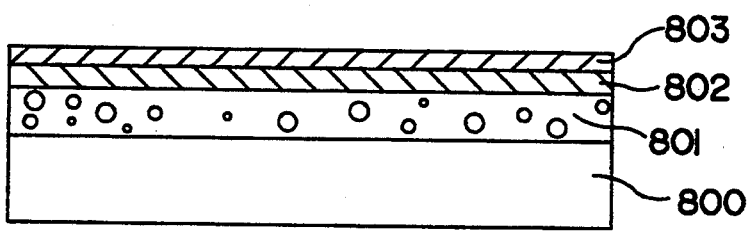
Figure 8C:
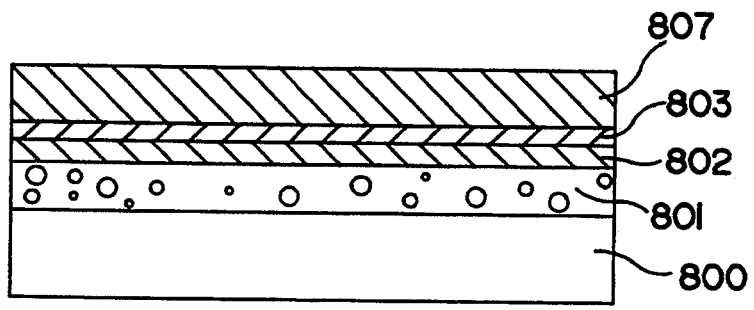

A p-type (100) substrate 800 having a thickness of 625 μm and a resistivity of 0.01 Ω·cm, 5 inches in diameter, was made porous only to a depth of 20 μm from the surface to form a porous layer 801 (FIG. 8A). An epitaxial silicon layer 802 was formed to a thickness of 0.15 μm on the porous silicon layer 801 in the same manner as in Example 1, and then the surface of the epitaxial layer 802 was oxidized to a depth of 0.1 μm by thermal oxidation to form an oxide layer 803 (FIG. 8B), whereby the thickness of the epitaxial layer was reduced to 0.1 μm. A PSG (phosphosilicate glass) film 807 having a thickness of 15 μm was deposited from TEOS (tetraethoxysilane/O$_3$) onto the surface of the oxide film 803 by CVD under the atmospheric pressure, and then the PSG film was annealed in an oxygen atmosphere at 1,000° C. for 30 minutes to remove moistures from the film and also to densify the film. The surface of the PSG film was made flat by polishing (FIG. 8C) to prepare a first substrate.

Figure 8D:
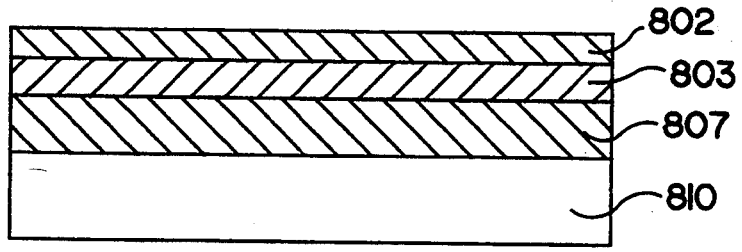

A melt quartz substrate 810, 5 inches in diameter, was used as a second substrate, and bonded to the first substrate by heat treatment at 500° C. in the same manner as Example 1. The monocrystalline silicon part 800 of the first substrate was removed to a depth of about 600 μm from the open side thereof by grinding, and then the porous silicon layer 801 was selectively etched in an HF/H$_2$O$_2$ solution to obtain an SOI substrate having a monocrystalline silicon layer having a thickness of 0.1 μm on the transparent SiO$_2$ substrate (FIG. 8D). Ultimately, the finished substrate was annealed in a nitrogen atmosphere at 1,000° C. for 30 minutes to increase the bonding strength of the bonding interface.

EXAMPLE 9

This example will be explained, referring to FIGS. 9A and 9B.

Figure 9A:
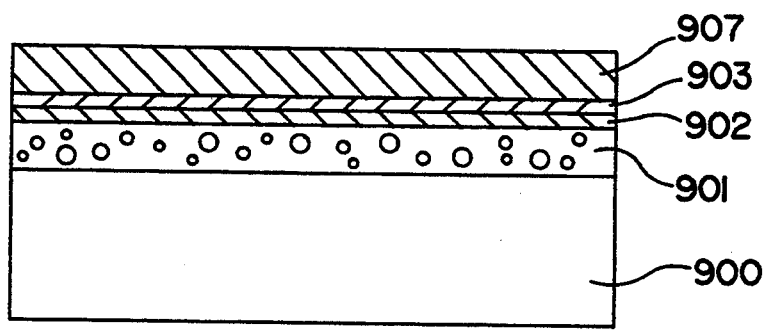
Figure 9B:
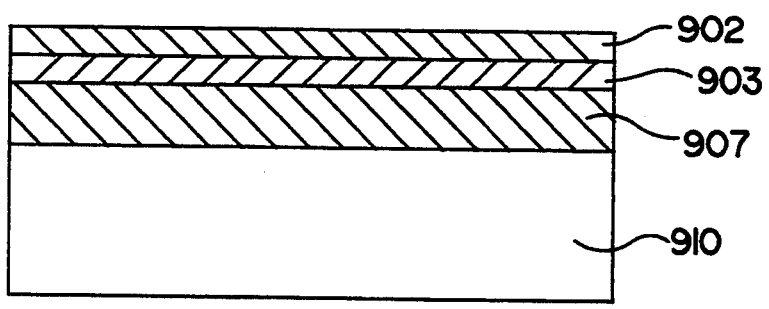

A first substrate was prepared in the same manner as in Example 7 (FIG. 9A). Crystallized glass 910 having an approximate coefficient of thermal expansion to that of silicon was used as a second substrate, and bonded to the first substrate. After the bonding, annealing was carried out at 830° C., which was by 20° C. lower than the softening temperature of the crystallized glass, 850° C. Then, a monocrystalline silicon substrate 900 and a porous silicon layer 901 were successively removed in the same manner as in Example 7 to obtain an SOI substrate having a monocrystalline silicon layer having a thickness of 0.1 μm on the transparent crystallized glass substrate (FIG. 9B).

EXAMPLE 10

This example will be explained, referring to FIGS. 10A–10D.

Figure 10A:
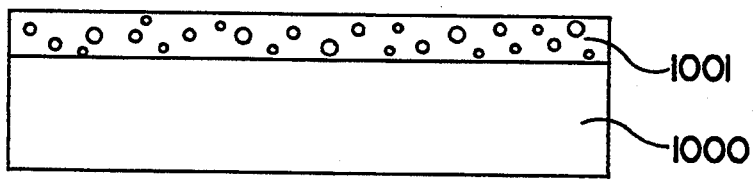
Figure 10B:
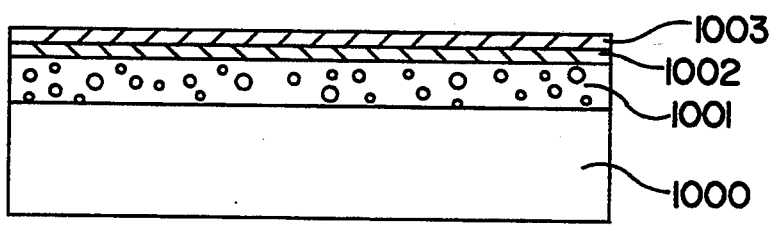
Figure 10C:
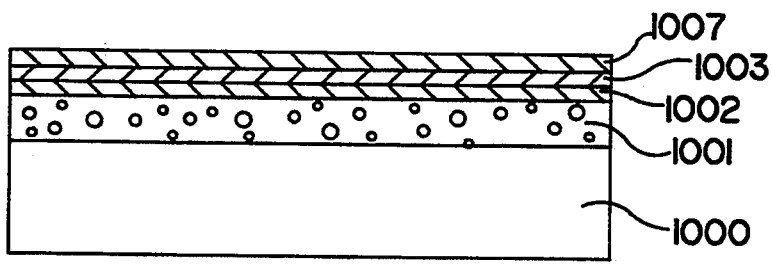

A p-type (100) substrate 1000 having a thickness of 625 μm and a resistivity of 0.01 Ω·cm, 5 inches in diameter, was made porous only to a depth of 20 μm from the surface to form a porous layer 1001 (FIG. 10A). An epitaxial silicon layer 1002 was formed to a thickness of 0.15 μm on the porous silicon layer 1001 in the same manner as in Example 1, and then the surface of the epitaxial layer 1002 was oxidized to a depth of 0.1 μm by thermal oxidation to form an oxide layer 1003 (FIG. 10B), whereby the thickness of the epitaxial layer was reduced to 0.1 μm. An $SiO_2$ film (NSG film) 1007 having a thickness of 0.7 μm was deposited on the surface of the oxide film 1003 from $SiH_4/O_2$ by CVD under the atmospheric pressure, and annealed in a nitrogen atmosphere at 950° C. for 30 minutes. The surface of NSG 1007 was polished to a mirror surface to prepare a first substrate (FIG. 10C).

Figure 10D:
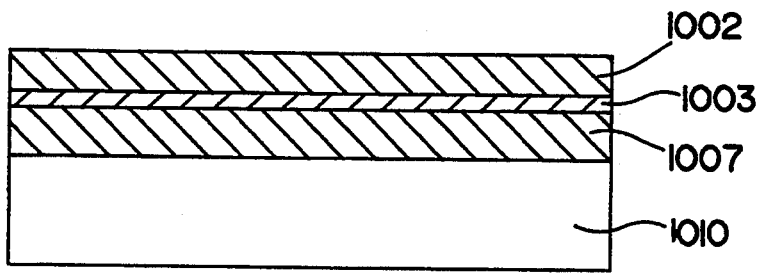

A silicon substrate 1010, 5 inches in diameter, was used as a second substrate, and bonded to the first substrate in the same manner as Example 1. The monocrystalline silicon part 1000 of the first substrate was removed to a depth of about 600 μm from the open side thereof by grinding, and then the porous silicon layer 1001 was selectively etched in an $HF/H_2O_2$ solution to obtain an SOI substrate having a monocrystalline silicon layer having a thickness of 0.1 μm on the $SiO_2$ layer having a thickness of 0.8 μm (FIG. 10D).

EXAMPLE 11

Figure 11A:
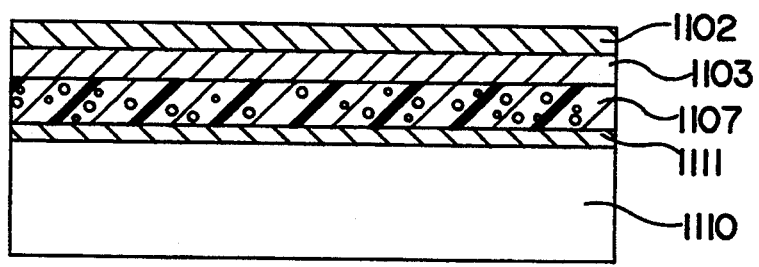
Figure 11B:
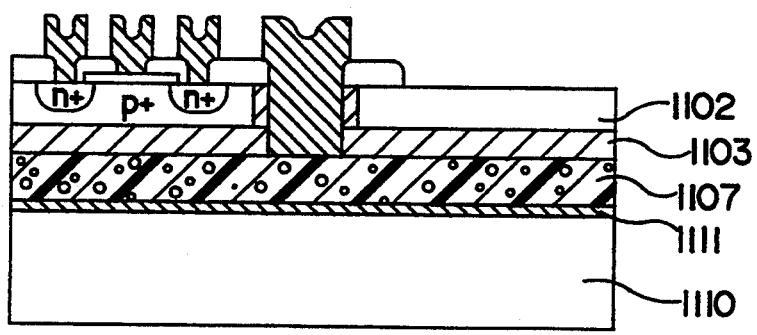

This example will be explained, referring to FIGS. 11A and 11B.

An SOI substrate comprising an epitaxial layer 1102 having a thickness of 0.75 μm, a thermally oxidized layer 1103 having a thickness of 0.5 μm, a polycrystalline silicon layer 1107 having a thickness of 10 μm, a thermally oxidized layer 1111 having a thickness of 0.5 μm and a silicon substrate 1110, successively formed in the order from the surface layer was prepared in the same manner as in Example 4 (FIG. 11A), where in the formation of the polycrystalline silicon layer a $B_2H_6$ gas was used to make a p-type polycrystalline layer having a boron concentration of about $10^{17}$ cm$^{-3}$.

Then, nMOS transistor was formed on the SOI substrate by the ordinary process. In order to control the substrate potential of the transistor, contact holes reaching the polycrystalline silicon layer 1107 were made and aluminum electrodes was vapor deposited by sputtering to form an MOS transistor, as shown in FIG. 11B. The substrate potential, which had been hard to control from the back side of the substrate due to the presence of the $SiO_2$ layer at the bonding interface, could be controlled from the surface of the substrate.

As described in detail above, the present bonded SOI substrate prepared by bonding a first substrate comprising a porous silicon, and a monocrystalline epitaxial growth layer, its oxide layer and a deposit layer, successively formed thereon, to a second substrate, heat treating the bonded substrates and selectively removing the porous silicon has no substantial influence of voids on the device-forming layer, even if voids are generated at the bonding interface, because the bonding interface is located at a position sufficiently far from the epitaxial growth layer, that is, the device-forming layer. That is, substrates having voids at the bonding interface have been all treated as failure products, but in the present invention voids can be treated as permissible to some extent and thus yield has been considerably increased.

What is claimed is:

1. A process for preparing a semiconductor substrate, which comprises a step of porousifying a silicon monocrystalline substrate to form a porous layer, a step of making a silicon monocrystalline thin film to epitaxially grow on a surface of the porous layer, a step of oxidizing the surface of the epitaxial growth layer, a step of forming a deposited film on the oxidized surface, thereby obtaining a first substrate, a step of closely contacting the deposited film of the first substrate to a second substrate, a step of heat treating the closely contacted substrates and a step of selectively etching the porous layer.

2. A process according to claim 1, wherein the deposited film is a film containing silicon atoms.

3. A process according to claim 2, wherein the deposited film is selected from a polycrystalline silicon film, an amorphous silicon film, a silicon oxide film and a silicon nitride film.

4. A process according to claim 1, where the deposited film is formed by CVD.

5. A process according to claim 1, wherein the deposited film has a thickness of 2 μm or more.

6. A process according to claim 5, wherein the deposited film has a thickness of 10 μm or more.

7. A process according to claim 1, wherein the heat treatment is carried out at 800° C. or more.

8. A process according to claim 1, wherein the oxide film obtained by oxidizing the surface of the epitaxial layer has a thickness of 0.5 μm to 1.0 μm.

9. A process according to claim 1, wherein the second substrates is a transparent substrate.

10. The process according to claim 1, including conducting the step of porousifying by anodization.

11. The process according to claim 9, wherein the second substrate comprises quartz.

12. The process according to claim 1, wherein the second substrate comprises silicon.

* * * * *